United States Patent
Lee et al.

(10) Patent No.: US 7,563,721 B2
(45) Date of Patent: Jul. 21, 2009

(54) METHOD FOR FABRICATING SEMICONDUCTOR DEVICE CAPABLE OF DECREASING CRITICAL DIMENSION IN PERIPHERAL REGION

(75) Inventors: Kyung-Won Lee, Kyoungki-do (KR); Ki-Won Nam, Kyoungki-do (KR)

(73) Assignee: Hynix Semiconductor Inc. (KR)

( * ) Notice: Subject to any disclaimer, the term of this patent is extended or adjusted under 35 U.S.C. 154(b) by 207 days.

(21) Appl. No.: 11/654,460

(22) Filed: Jan. 17, 2007

(65) Prior Publication Data

US 2007/0184664 A1    Aug. 9, 2007

Related U.S. Application Data

(63) Continuation of application No. 11/165,740, filed on Jun. 24, 2005, now Pat. No. 7,179,749.

(30) Foreign Application Priority Data

Jun. 25, 2004    (KR) .................. 10-2004-0048365

(51) Int. Cl.
  *H01L 21/461* (2006.01)
(52) U.S. Cl. ................... 438/706; 257/E21.017
(58) Field of Classification Search ............. 438/695, 438/706; 257/E21.017, E21.218
  See application file for complete search history.

(56) References Cited

U.S. PATENT DOCUMENTS 6,774,043 B2    8/2004    Yamaguchi et al. ......... 438/705
2004/0102041 A1    5/2004    Okudaira .................. 438/689
2004/0211981 A1    10/2004    Terauchi et al. ............. 257/202
2005/0009358 A1    1/2005    Choi et al. ................. 438/706
2006/0172540 A1*    8/2006    Marks et al. ................ 438/700

FOREIGN PATENT DOCUMENTS

JP    5-326899    12/1993
JP    2000-58827    2/2000

* cited by examiner

*Primary Examiner*—Thao P. Le
(74) *Attorney, Agent, or Firm*—Blakely, Sokoloff, Taylor & Zafman

(57) ABSTRACT

A method for fabricating a semiconductor device where a critical dimension in a peripheral region is decreased. The method includes the steps of: forming a silicon nitride layer on a substrate including a cell region and a peripheral region; forming a silicon oxynitride layer on the silicon nitride layer; forming a line-type photoresist pattern on the silicon oxynitride layer such that the photoresist pattern in the cell region has a width larger than that of a final pattern structure and the photoresist pattern in the peripheral region has a width that reduces an incidence of pattern collapse; etching the silicon oxynitride layer and the silicon nitride layer until widths of a remaining silicon oxynitride layer and a remaining silicon nitride layer are smaller than the width of the photoresist pattern used as an etch mask through suppressing generation of polymers; and over-etching the remaining silicon nitride layer.

10 Claims, 6 Drawing Sheets

METHOD FOR FABRICATING SEMICONDUCTOR DEVICE CAPABLE OF DECREASING CRITICAL DIMENSION IN PERIPHERAL REGION

CROSS-REFERENCE TO RELATED APPLICATION

This application is a continuation of U.S. application Ser. No. 11/165,740 filed Jun. 24, 2005, now U.S. Pat. No. 7,179,749.

1. Field of the Invention

The present invention relates to a method for fabricating a semiconductor device; and, more particularly, to a method for forming a line-type pattern with a reduced line width.

2. Description of Related Arts

As the design rule of semiconductor devices has been decreased, line widths of line-type patterns such like gate structures in semiconductor devices, for instance, in dynamic random access memory (DRAM) devices, have been proportionally decreased in a cell region as well as in a peripheral region. As an example, in a DRAM device applied with the design rule of 100 nm, a mask in a peripheral region has a line width of 1.130 μm corresponding to a develop inspection critical dimension (DICD) and a line width of 0.170 μm corresponding to a final inspection critical dimension. However, graphic devices require a critical dimension that is decreased in more extents to meet a demand for high-speed operation.

Despite of this demand, the decrease in the DICD of the mask has reached a limitation because of a pattern collapse phenomenon. Also, an etching process for forming the line-type pattern causes the FICD of the line-type pattern to increase compared with the DICD of the line-type pattern, and thus, it is limited to decrease a CD in the peripheral region to an intended degree.

FIG. 1 is a cross-sectional view showing a change in a CD of a conventional mask pattern.

As shown, a gate conductive layer 101 is formed on a substrate 100 defined with a cell region A and a peripheral region B. A gate hard mask 102 is patterned on the gate conductive layer 101, overlaid with a patterned anti-reflective coating layer 103. A portion of a photoresist pattern 104 remains on the patterned anti-reflective coating layer 103.

Herein, the gate conductive layer 101 includes a stack structure of polysilicon and tungsten silicide. The gate hard mask 102 and the patterned anti-reflective coating layer 103 are formed by using silicon nitride and silicon oxynitride, respectively. Also, reference denotations W1 and W2 denote DICDs, which are CDs in the cell region A and the peripheral region B, respectively, when the photoresist pattern 104 is formed. Reference denotations W1A and W2B denote FICDs of a final pattern structure, which are CDs in the cell region A and the peripheral region B, respectively, after a final pattern structure is formed.

As shown in FIG. 1, after the final pattern structure is formed, the CDs of the pattern structure in the cell region A and the peripheral region B increase.

FIG. 2 is a graph showing a line width of a conventional gate structure. Herein, the line width of the gate structure is a FICD.

As shown, the line width of the conventional gate structure in the cell region is approximately 0.120 μm, while that of the gate structure in the peripheral region is approximately 0.170 μm.

Accordingly, there may be a problem in that the FICD of the conventionally formed pattern is increased compared with the DICD of the originally formed pattern.

SUMMARY OF THE INVENTION

It is, therefore, an object of the present invention to provide a method for fabricating a semiconductor device capable of decreasing a critical dimension of a line-type pattern in a peripheral region.

In accordance with an aspect of the present invention, there is provided a method for fabricating a semiconductor device, including the steps of: forming a silicon nitride layer on a substrate divided into a cell region and a peripheral region; forming a silicon oxynitride layer as an anti-reflective coating layer on the silicon nitride layer; forming a line-type photoresist pattern on the silicon oxynitride layer such that the photoresist pattern in the cell region has a width larger than that of a final pattern structure and the photoresist pattern in the peripheral region has a width that suppresses an incidence of pattern collapse; sequentially etching the silicon oxynitride layer and the silicon nitride layer by using the photoresist pattern as an etch mask, the etching continues until widths of a remaining silicon oxynitride layer and a remaining silicon nitride layer are smaller than the width of the photoresist pattern through suppressing polymers from being generated; and over-etching the remaining silicon nitride layer.

In accordance with another aspect of the present invention, there is provided a method for fabricating a semiconductor device, including the steps of: forming a conductive layer on a substrate divided into a cell region and a peripheral region; forming a silicon nitride layer as a hard mask on the conductive layer; forming a silicon oxynitride layer as an anti-reflective coating layer on the silicon nitride layer; forming a line-type photoresist pattern on the silicon oxynitride layer such that the photoresist pattern in the cell region has a width larger than that of a final pattern structure and the photoresist pattern in the peripheral region has a width that suppresses an incidence of pattern collapse; sequentially etching the silicon oxynitride layer and the silicon nitride layer by using the photoresist pattern as an etch mask, the etching continues until widths of a remaining silicon oxynitride layer and a remaining silicon nitride layer are smaller than the width of the photoresist pattern through suppressing polymers from being generated; over-etching the remaining silicon nitride layer; removing the photoresist pattern; etching the conductive layer by using the remaining silicon oxynitride layer and the remaining silicon nitride layer as an etch mask; and removing the remaining silicon oxynitride layer.

BRIEF DESCRIPTION OF THE DRAWINGS

The above and other objects and features of the present invention will become better understood with respect to the following description of the preferred embodiments given in conjunction with the accompanying drawings, in which.

DETAILED DESCRIPTION OF THE INVENTION

A method for fabricating a semiconductor device capable of decreasing a critical dimension in a peripheral region in accordance with preferred embodiments of the present invention will be described in detail with reference to the accompanying drawings.

Figure 3A:
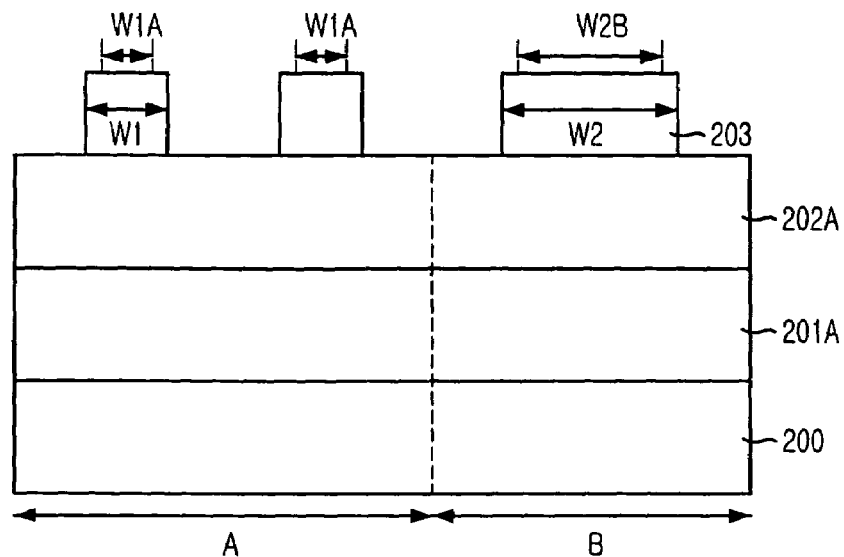
FIGS. 3A and 3B are cross-sectional views illustrating a process for forming pattern structures in accordance with a preferred embodiment of the present invention.
Figure 3B:
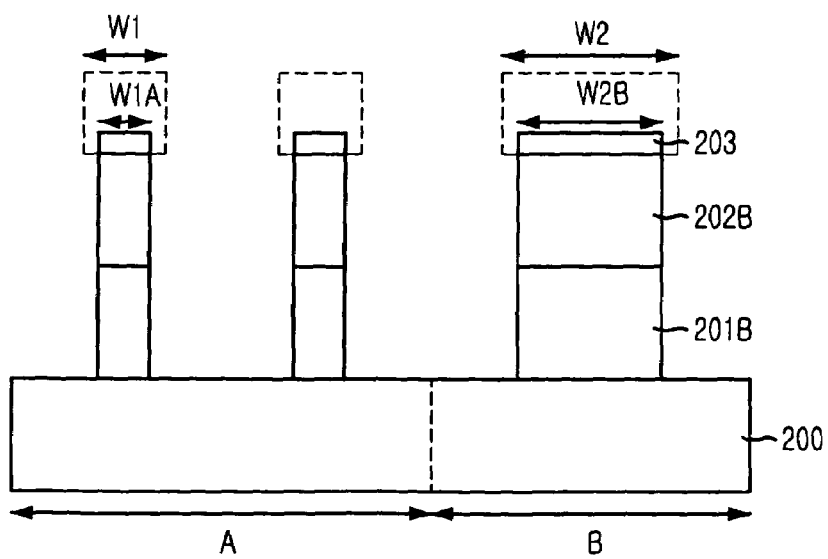

FIGS. 3A and 3B are cross-sectional views illustrating a process for forming pattern structures in accordance with a preferred embodiment of the present invention.

Referring to FIG. 3A, a silicon nitride layer 201A is formed as an etch target layer on a substrate 200 divided into a cell region A and a peripheral region B and in which various device elements are prepared. Then, a silicon oxynitride layer 202A, which is an anti-reflective coating layer, is formed on the silicon nitride layer 201A. Afterwards, a photoresist pattern 203 for forming a line-type pattern is formed on the silicon oxynitride layer 202A by employing photolithography. At this time, a width of a final pattern structure, which will be formed in the cell region A, i.e., a final inspection critical dimension (FICD) in the cell region is expressed as W1A. However, because of a bias process, which causes a decrease in the CD of the final pattern structure, the photoresist pattern 203 is formed with a width W1 larger than the width W1A of the final pattern structure. Herein, the width W1 of the photoresist pattern 203 is a develop inspection critical dimension (DICD).

Meanwhile, to maintain the aforementioned bias process, the photoresist pattern 203 should not be damaged during an etching process for etching the silicon nitride layer 201A. Concurrently, the etching process is carried out under a recipe that causes the silicon nitride layer 201A to be etched in higher amounts.

As shown in FIG. 3B, under the above etch recipe, the silicon oxynitride layer 202A and the silicon nitride layer 201A are sequentially etched by using the photoresist pattern 203 as an etch mask. As shown, in the cell region A, the width W1 of the photoresist pattern 203, i.e., the DICD in the cell region A, is decreased to the width W1A. Also, in the peripheral region B, a width W2 of the photoresist pattern 203, i.e., the DICD in the peripheral region B is decreased to a width W2B of the final pattern structure corresponding to FICD. Herein, reference numerals 202B and 201B denote a patterned silicon oxynitride layer and a patterned silicon nitride layer, respectively.

In more detail, the silicon oxynitride layer 202A shown in FIG. 3A is etched by using a mixed gas of $CHF_3$ and $CF_4$. At this time, the $CHF_3$ gas is used in a ratio ranging from approximately 1.1 to approximately 1.6 while the $CF_4$ gas is used in a ratio of approximately 1. Also, the silicon nitride layer 201A shown in FIG. 2A is etched by using the etch gases of $CHF_3$ and $CF_4$ in a different ratio from the above mentioned one; that is, the ratio of the $CF_4$ gas ranges from approximately 1.1 to approximately 2, while that of the $CHF_3$ gas is approximately 1. At this time, a temperature of a chuck is set to be above approximately 50° C. to control an amount of polymers introduced into a wafer, so that the bias process is maintained.

A portion of the silicon nitride layer 201A still remaining after the formation of the patterned silicon nitride layer 201B is subjected to an over-etching process by providing an etch gas obtained by mixing $CHF_3$ gas in a ratio ranging from approximately 1.5 to approximately 3 with $CF_4$ gas in a ratio of approximately 1. This specifically set ratio of the etch gases results in a passivation process, which prevents the above resulting pattern structure from being damaged during the over-etching process. Therefore, in the cell region A, the FICD of the final pattern structure formed according to the present invention is nearly the same to or smaller than that of the conventionally formed final pattern structure. On the other hand, in the peripheral region B, the FICD of the final pattern structure formed according to the present invention is decreased in more extents compared with the FICD of the conventionally formed final pattern structure.

Figure 4A:
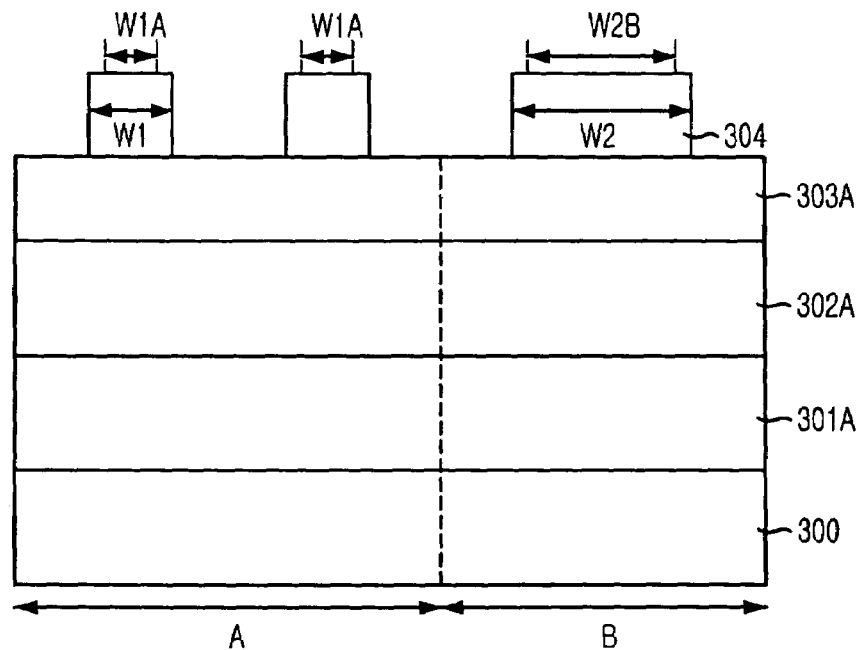
FIGS. 4A to 4C are cross-sectional views showing a process for forming gate structures in accordance with another preferred embodiment of the present invention.
Figure 4B:
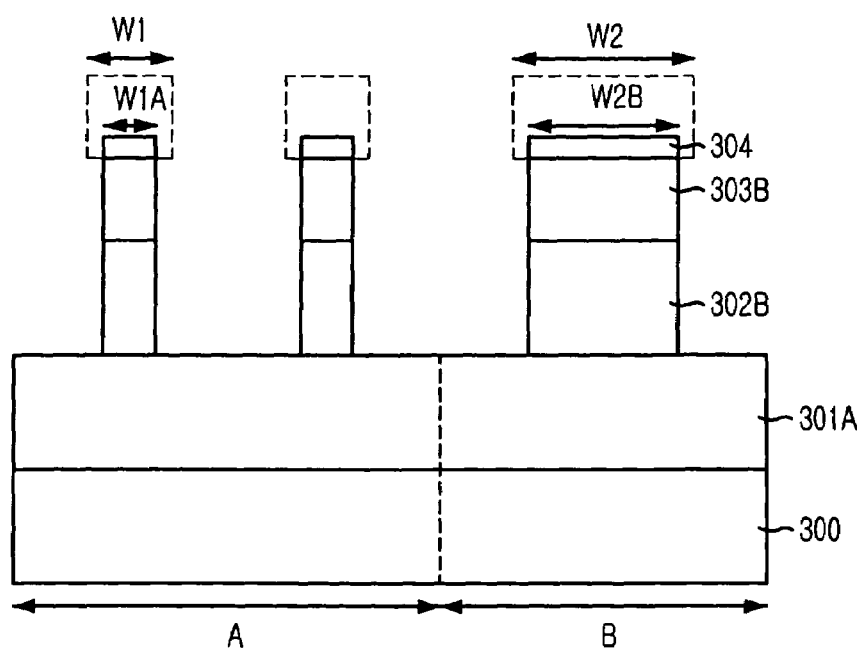
Figure 4C:
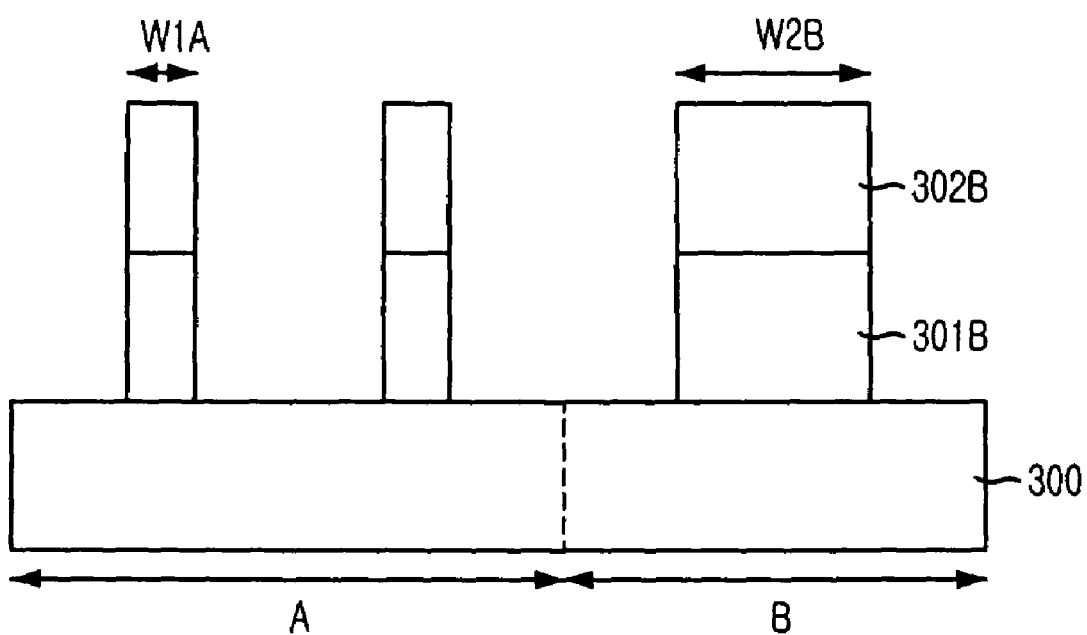

FIGS. 4A to 4C are cross-sectional views illustrating a process for forming gate structures in accordance with another preferred embodiment of the present invention.

Referring to FIG. 4A, a gate conductive layer 301A, which is an etch target layer, is formed on a substrate 300 divided into a cell region A and a peripheral region B and in which various device elements are prepared. Then, a silicon nitride layer 302A and a silicon oxynitride layer 303A, which is an anti-reflective coating layer, are sequentially formed on the gate conductive layer 301A. Afterwards, a photolithography process is formed on the silicon oxynitride layer 303A to thereby form a photoresist pattern 304 for forming a line-type gate structure. Herein, the gate conductive layer 301A includes a material selected from a group consisting of polysilicon, tungsten, tungsten silicide and a combination thereof.

At this time, a width of an aimed final gate structure in the cell region A, i.e., the FICD is expressed as W1A. However, because of a bias process, the width W1A of the aimed final gate structure is decreased. Thus, a width of the photoresist pattern 304 is set to be larger than the width W1A of the aimed final gate structure. Herein, the width of the photoresist pattern 304 is a DICD and is denoted as W1.

Meanwhile, to maintain the aforementioned bias process, the photoresist pattern 304 should not be damaged during an etching process performed on the silicon nitride layer 302A and also, the etching process is carried out under a recipe that causes the silicon nitride layer 302A to be etched in higher amounts.

Referring to FIG. 4B, under such etch recipe, the silicon oxynitride layer 303A and the silicon nitride layer 302A are sequentially etched by using the photoresist pattern 304 as an etch mask. Reference denotations 303B and 302B represent a patterned silicon oxynitride layer and a patterned silicon nitride layer, respectively.

Through this etching process, the DICDs in the cell region A and the peripheral region B, i.e., the width W1 of the photoresist pattern 304 in the cell region A and the width W2 of the photoresist pattern 304 in the peripheral region B are decreased to the width W1A of the aimed final gate structure in the cell region A and the width W2B of the aimed final gate structure in the peripheral region B.

In more detail of the etch recipe, the silicon oxynitride 303A shown in FIG. 4A is etched by using an etch gas obtained by mixing an etch gas of $CHF_3$ gas in a ratio ranging from approximately 1.1 to approximately 1.6 with another etch gas of $CF_4$ in a ratio of approximately 1. Also, the silicon nitride layer 302A shown in FIG. 3A is etched by using the etch gases of $CHF_3$ and $CF_4$ in a different ratio from the aforementioned one. That is, the etch gas of $CH_4$ has a ratio ranging from approximately 1.1 to approximately 2, while the etch gas of $CHF_3$ has a ratio of approximately 1. At this time, a temperature of a chuck is set to be more than approximately 50° C. to control an amount of polymers introduced into a wafer, so that the bias process is maintained.

Meanwhile, a portion of the silicon nitride layer 302A still remaining after the patterned silicon nitride layer 302B is formed is subjected to an over-etching process. At this time, the etch gas of $CHF_3$ is used in a ratio ranging from approximately 1.5 to approximately 3, while the etch gas of $CH_4$ is used in a ratio of approximately 1. This specifically set ratio of the etch gases results in a passivation process, thereby protecting the gate structure from the over-etching process.

Referring to FIG. 4C, the photoresist pattern 304 is removed by a photoresist strip process. Then, the gate conductive layer 301A is etched by using the patterned silicon oxynitride layer 303B and the patterned silicon nitride layer 302B as an etch mask. Herein, the patterned silicon oxynitride layer. 303B and the patterned silicon nitride layer 302B are an anti-reflective coating layer and a gate hard mask, respectively. Thereafter, the patterned silicon oxynitride layer 303B is removed, thereby completing the formation of the gate structure including the patterned silicon nitride layer 302B and a patterned gate conductive layer 301B. Therefore, in the cell region A, the FICD of the finally formed gate structure according to the present invention is nearly the same to or smaller than that of the conventionally formed gate structure. On the other hand, in the peripheral region B, the FICD of the finally formed gate structure according to the present invention is decreased in more extents compared with the FICD of the conventionally formed gate structure.

Figure 5:
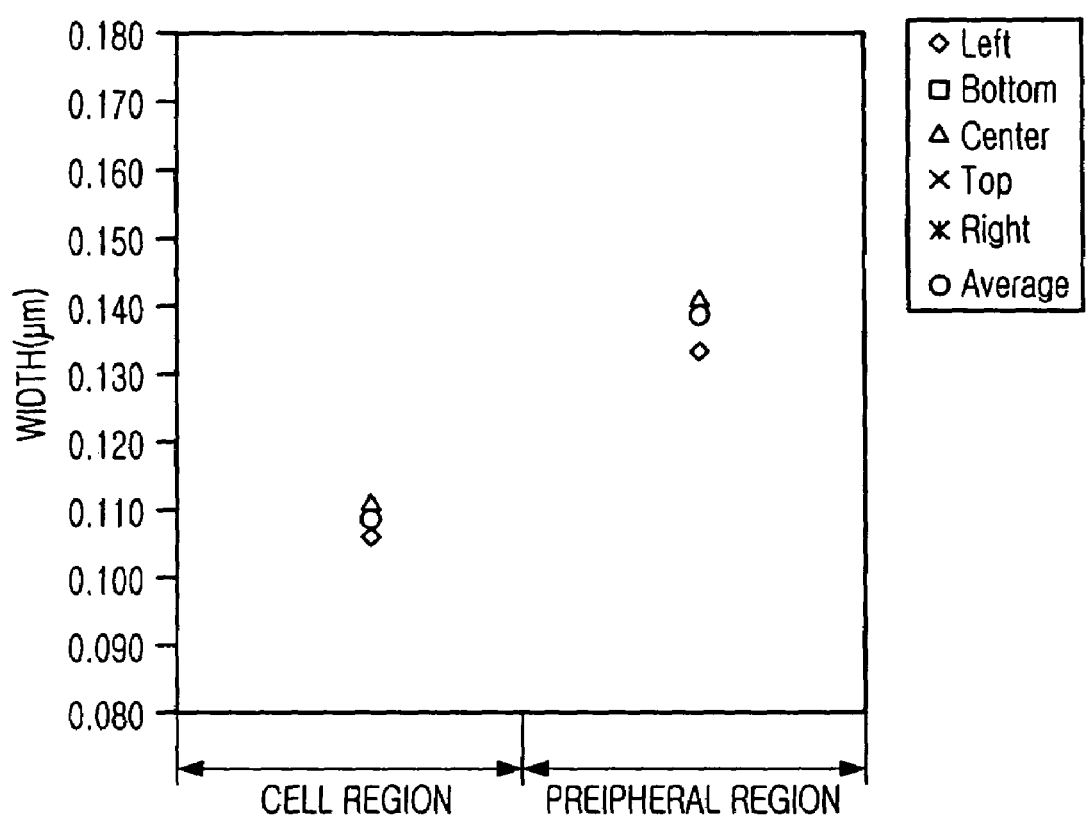
FIG. 5 is a graph showing a line width of a gate structure formed in a cell region and in a peripheral region in accordance with the present invention.

FIG. 5 is a graph showing a line width of a gate structure formed in a cell region and a peripheral region in accordance with the present invention. Herein, the line width of the gate structure is a FICD.

Figure 1:
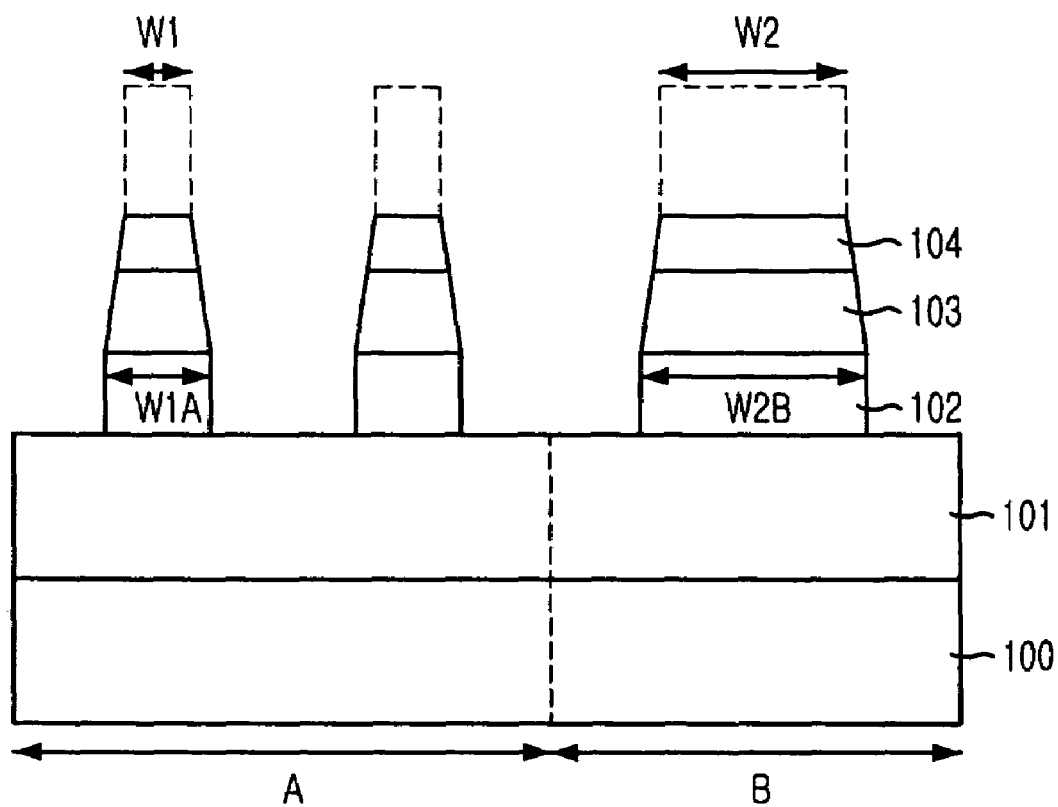
FIG. 1 is a cross-sectional view showing a change in a critical dimension of a conventional mask pattern.
Figure 2:
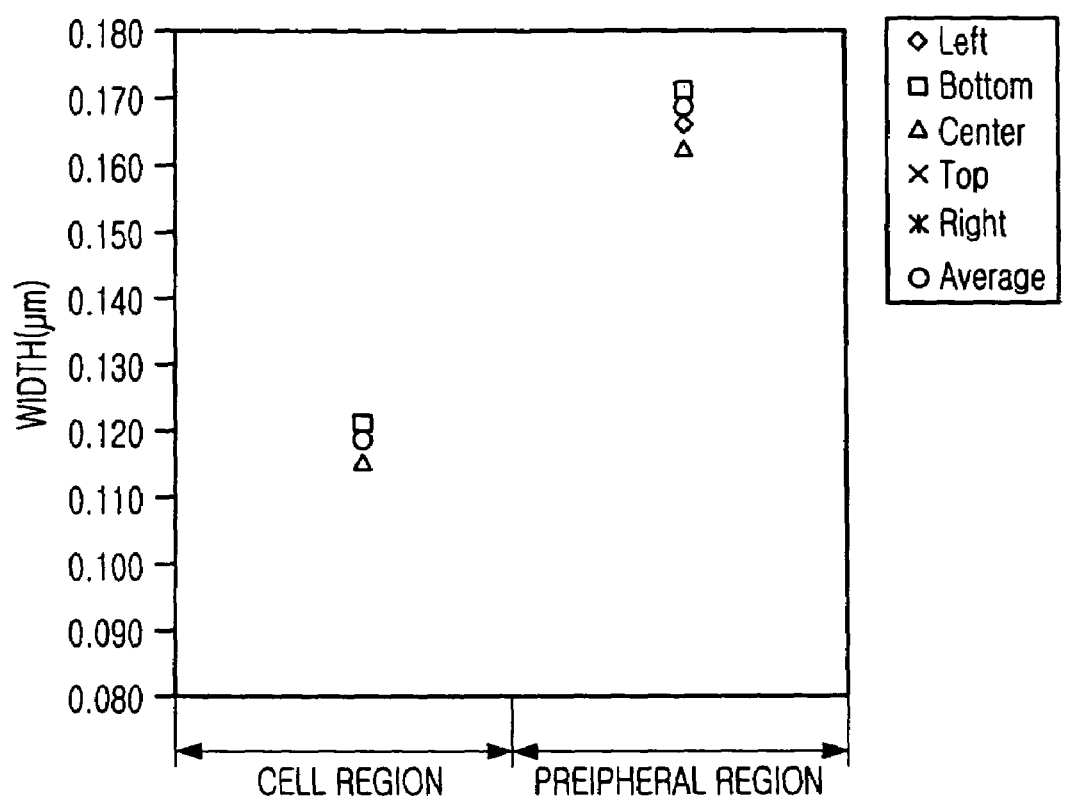
FIG. 2 is a graph showing a line width of a conventional gate structure in a cell region and in a peripheral region.

With reference to FIG. 2, the line width of the conventional gate structure in the cell region is approximately 0.120 μm, while that of the gate structure in the peripheral region is approximately 0.170 μm. On the other hand, as shown in FIG. 5, the line width of the gate structure in the cell region formed in the cell region and in the peripheral region according to the present invention is approximately 0.110 μm, while that of the gate structure in the peripheral region is less than approximately 0.140 μm. Hence, it is verified that compared with the line width of the conventional gate structure, the line width of the gate structure in the peripheral region is decreased in more extents.

In accordance with the preferred embodiment of the present invention, in the cell region, the DICD of the mask pattern for forming a line-type pattern is increased compared with that of the conventional mask pattern. On the other hand, in the peripheral region, the mask pattern is initially defined with the minimum DICD that prevents an incidence of pattern collapse, and then, the bottom pattern structure in the cell region is subjected to the over-etching process with the application of a specific etch recipe. While the bottom pattern structure in the cell region is over-etched, the bottom pattern structure in the peripheral region is also etched in higher amounts, thereby obtaining an intended line width. As a result of this effect, a scale of integration can be improved.

Although the gate structure formation process is exemplified in the preferred embodiment of the present invention, this exemplified pattern formation can be applied to any line-type patterns including the silicon oxynitride layer as an anti-reflective coating layer and the silicon nitride layer as a hard mask.

The present application contains subject matter related to the Korean patent application No. KR 2004-0048365, filed in the Korean Patent Office on Jun. 25, 2004, the entire contents of which being incorporated herein by reference.

While the present invention has been described with respect to certain preferred embodiments, it will be apparent to those skilled in the art that various changes and modifications may be made without departing from the spirit and scope of the invention as defined in the following claims.

What is claimed is:

1. A method for fabricating a semiconductor device, the method comprising:
    forming an etch target layer over a cell region and a peripheral region of the semiconductor device;
    forming a hard mask layer over the etch target layer;
    forming an anti-reflective coating layer over the hard mask layer;
    forming a line-type photoresist pattern over the anti-reflective coating layer such that the photoresist pattern in the cell region has a width larger than that of a final pattern structure and the photoresist pattern in the peripheral region has a width that suppresses an incidence of pattern collapse;
    sequentially etching the anti-reflective coating layer and the hard mask layer by using the photoresist pattern as an etch mask until widths of a remaining anti-reflective layer and a remaining hard mask layer are smaller than the width of the photoresist pattern;
    removing the photoresist pattern;
    etching the etch target layer by using the remaining anti-reflective layer and the remaining hard mask layer as an etch mask; and
    removing the remaining anti-reflective layer.

2. The method of claim 1, before the removing of the photoresist pattern, further comprising over-etching the remaining hard mask layer.

3. The method of claim 2, wherein the hard mask layer includes a silicon nitride layer.

4. The method of claim 3, wherein the anti-reflective layer includes a silicon oxynitride layer.

5. The method of claim 4, wherein the sequentially etching and the over-etching use a mixed gas of $CHF_3$ and $CF_4$.

6. The method of claim 5, wherein at the sequentially etching, a temperature of a chuck is maintained at approximately 50°C.

7. The method of claim 5, wherein when the anti-reflective layer is etched, a ratio of the $CHF_3$ gas to $CF_4$ gas ranges from approximately 1.1:1 to approximately 1.6:1.

8. The method of claim 5, wherein when the hard mask layer is etched, a ratio of the $CHF_3$ gas to $CF_4$ gas ranges from approximately 1:1.1 to approximately 1:2.

9. The method of claim 5, wherein when the remaining hard mask layer is over-etched, a ratio of the $CHF_3$ gas to $CF_4$ gas ranges from approximately 1.5:1 to approximately 3:1.

10. The method of claim 1, wherein the sequentially etching includes suppressing polymers from being generated.

* * * * *